United States Patent [19]
Fujino et al.

[11] Patent Number: 5,784,174
[45] Date of Patent: Jul. 21, 1998

[54] METHOD FOR MANAGING MEMORY DATA AT POWER-UP

[75] Inventors: Toru Fujino, Urawa; Seishi Ejiri, Kawasaki; Akemi Sato, Yokohama; Kazuhiro Sugawara, Tokyo, all of Japan

[73] Assignee: Canon Kabushiki Kaisha, Tokyo, Japan

[21] Appl. No.: 456,724

[22] Filed: Jun. 1, 1995

[30] Foreign Application Priority Data

Jun. 3, 1994 [JP] Japan .................. 6-145711

[51] Int. Cl.⁶ .................. B41B 15/00; B41J 15/00; G06F 15/00; H04N 1/00
[52] U.S. Cl. .................. 358/404; 358/444; 395/113; 395/115; 395/116
[58] Field of Search .................. 358/404, 444, 358/442; 395/115, 112, 113, 116, 520, 521, 507, 427, 872, 875, 493

[56] References Cited

U.S. PATENT DOCUMENTS

| | | | |
|---|---|---|---|
| 5,406,529 | 4/1995 | Asano | 365/230.03 |
| 5,481,374 | 1/1996 | Tachibana et al. | 358/404 |
| 5,493,574 | 2/1996 | McKinley | 371/40.1 |
| 5,537,218 | 7/1996 | Negi | 358/444 |

*Primary Examiner*—Kim Yen Vu
*Assistant Examiner*—Kimberly A. Williams
*Attorney, Agent, or Firm*—Fitzpatrick, Cella, Harper & Scinto

[57] ABSTRACT

A non-volatile memory is divided into blocks, data in the memory is managed by management information including a plurality of data management records and a plurality of page management records. At the power-up, whether there is an error in the management information or not is determined and the data in the memory is cleared in accordance with the determination result to prevent a malfunction due to the destruction of data.

22 Claims, 5 Drawing Sheets

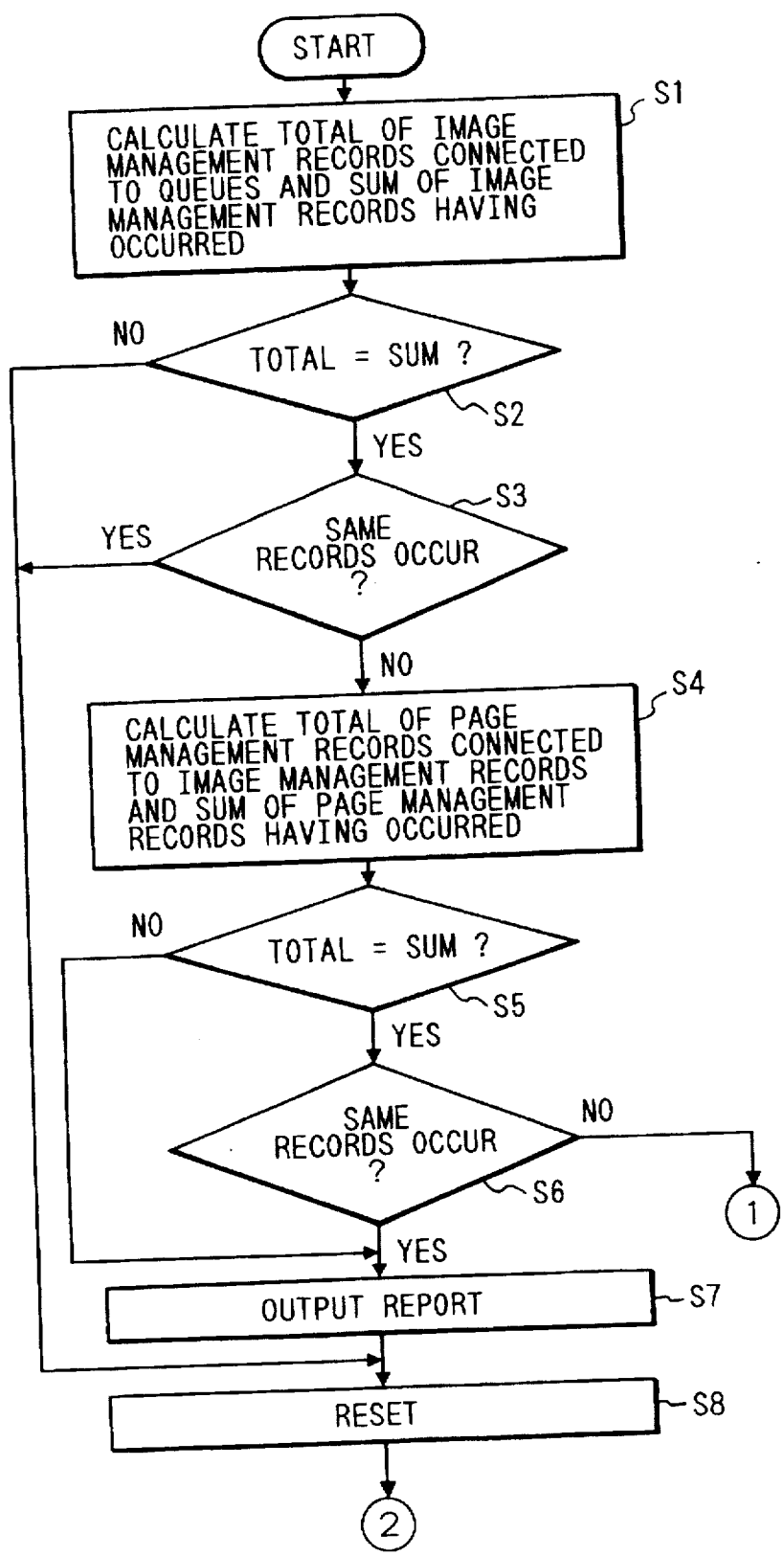

METHOD FOR MANAGING MEMORY DATA AT POWER-UP

BACKGROUND OF THE INVENTION

1. Field of the Invention

The present invention relates to a method for managing memory data at power-up.

2. Related Background Art

A prior art facsimile apparatus stores image data in a memory and then transmits the image data stored in the memory.

In such a facsimile apparatus, since the reading of a document sheet and the transmission thereof are asynchronous, it is convenient to operate such that an operator may take back the document sheet without waiting for the completion of transmission and the multi-address transmission and the time designated transmission may be carried out, but since the image memory is stored in a volatile memory, it has a drawback in that the image is erased when the power supply is shut down by a power failure.

In order to solve such drawback, an apparatus which stores the image information in a non-volatile semiconductor memory or a hard disk or an apparatus which has a battery circuit separately from a power supply to refresh the memory to retain the memory content has been proposed.

In a facsimile apparatus in which the image is not erased at power-off, the reliability of the image at resumption of operation is important. If the management of the image memory is not adequate, an image which is different from the read or received image may be transmitted or recorded without anyone noting the destruction of the image memory content during the power shut down.

SUMMARY OF THE INVENTION

It is an object of the present invention to properly cope with the destruction of the memory content during the power shut-down.

It is another object of the present invention to prevent malfunction by checking at the power-up whether the data in the memory is normal or not.

Other objects of the present invention will be apparent from the following description of the embodiments and the accompanying drawings.

BRIEF DESCRIPTION OF THE DRAWINGS

FIG. 3 shows a flow chart of a memory verification operation in that embodiment.

DETAILED DESCRIPTION OF THE PREFERRED EMBODIMENT

An embodiment of the present invention is now explained in detail in conjunction with the drawings. In the following embodiment, a facsimile apparatus having an image data memory is explained.

Figure 1:
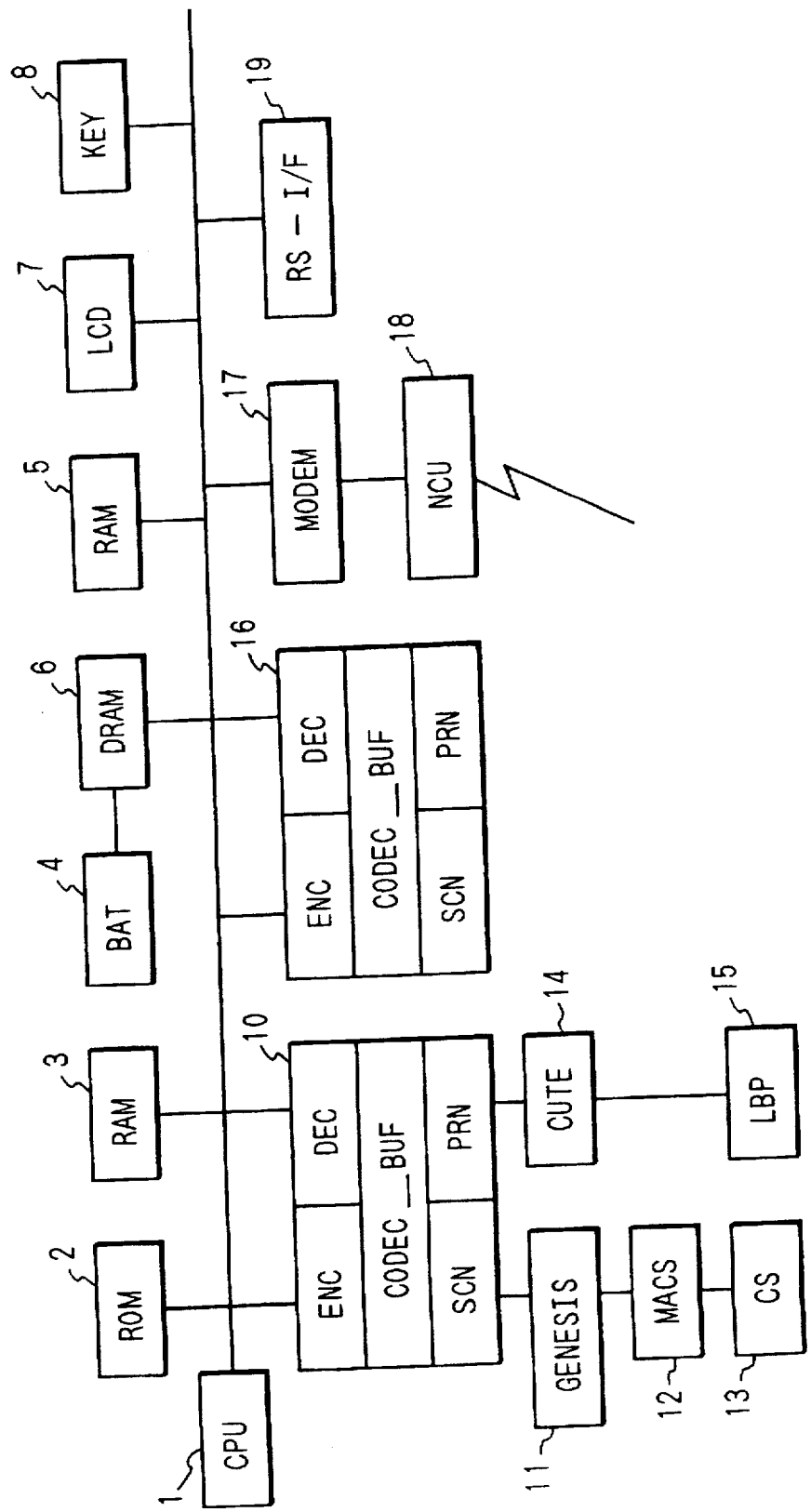
FIG. 1 shows a block diagram of one embodiment of the present invention.

FIG. 1 shows a block diagram of a configuration of a facsimile apparatus of the present embodiment.

A CPU 1 is a central processing unit which controls the overall system in accordance with a content of a program stored in a ROM 2. Operations under the control of the CPU 1 are now explained in sequence.

A read operation is first explained. A signal generated by a contact sensor (CS) 13 is shading-corrected by a correction circuit (MACS) 12. It is binarized and image-transformed by an image processing circuit (GENESIS) 11 and serially inputted to a read unit (SCN) of a read/write code/decode device (RW-CODEC) 10. The input image data is developed into an internal RAM (CODEC_BUF) of the RW-CODEC 10, compressed by an encoder (ENC) and stored in an image memory (DRAM) 6, and management information such as an acceptance number, address information, number of pages and storing image memory block information is stored in a RAM 3. BAT 4 denotes a battery.

A recording operation is now explained. The image encoded data stored in the DRAM 6 is decompressed by a decoding unit (DEC) of the RW-CODEC 10 and it is developed into the CODEC_BUF as image data. The developed image data is serially outputted from a recorded unit (PRN), and corrected and image-transformed by a recorded image processing circuit (CUTE) 14 and then it is printed out on a record sheet by a laser beam printer (LBP) 15.

A transmission operation is now explained. The image encoded data stored in the DRAM 6 is decompressed by a decoding unit (DEC) of a communication code/decode device (C-CODEC) 16 and it is developed into the CODEC_BUF as image data. The developed image data is encoded to transmission data by an encoding unit (ENC) of the C-CODEC 16 and it is transferred to a transmission buffer of the RAM 5. The transmission data transmitted to the transmission buffer is sent out to a line by a MODEM 17 one byte at a time. In the device 16, SCN denotes a read unit and PRN denotes a record unit.

A receiving operation is now explained. The received data is inputted to the MODEM 17 through an NCU 18, decoded and transferred to a reception buffer of the RAM 5 one byte at a time. The received data transferred to the reception buffer is decompressed by the decoding unit (DEC) of the C-CODEC 16, image error is checked and developed into the CODEC_BUF as image data. The developed image data is compressed by the encoding unit (ENC) of the C-CODEC 16 and stored in the DRAM 6, and the image management information is stored in the RAM 3.

An operator depresses a key (KEY) 8 to instruct or set various operations, and the content thereof is stored in the RAM 3 and monitored by a display unit (LCD) 7. The CPU 1 detects the keyed data and causes the LCD 7 to display necessary data.

RS-I/F 19 denotes an interface for connection with the computer.

Figure 2:
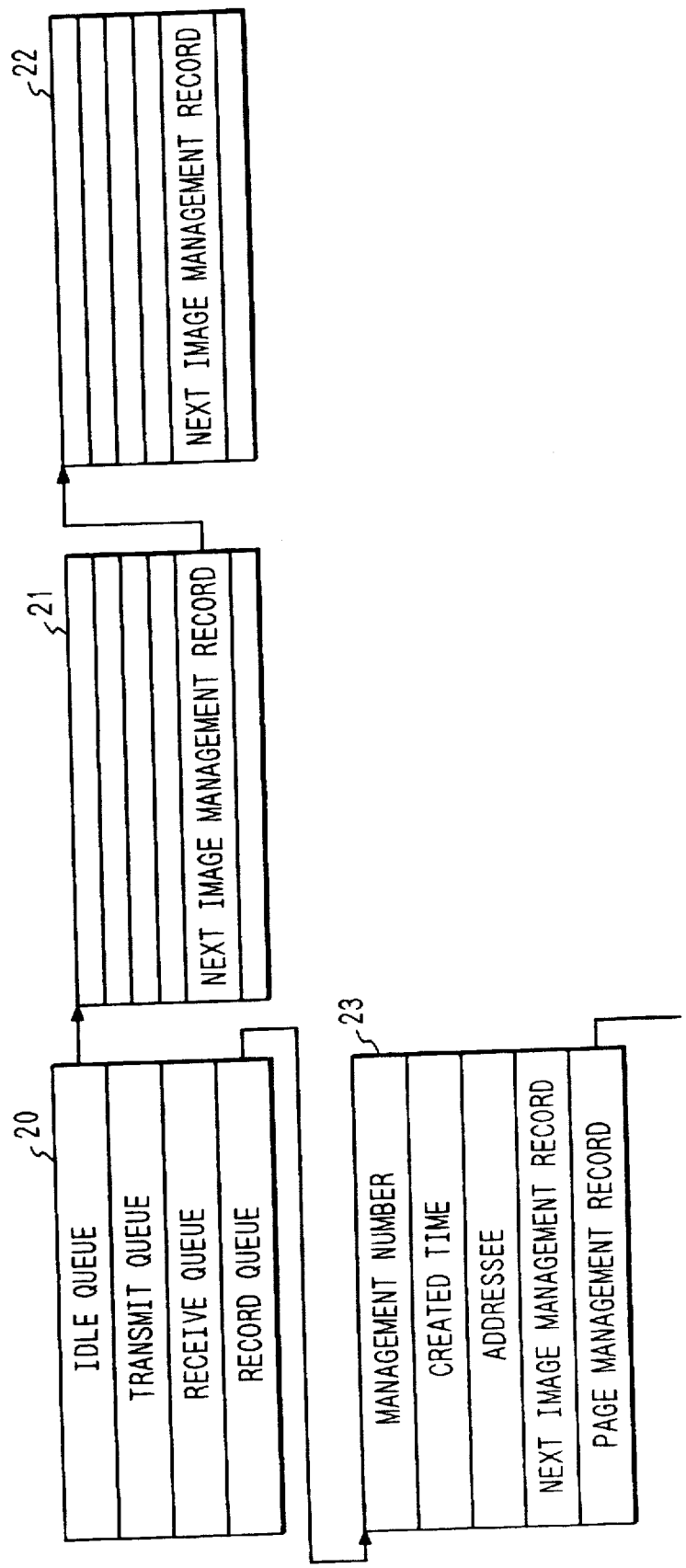
FIG. 2 is composed of FIGS. 2A and 2B conceptually illustrating a memory management system in that embodiment.
Figure 2B:
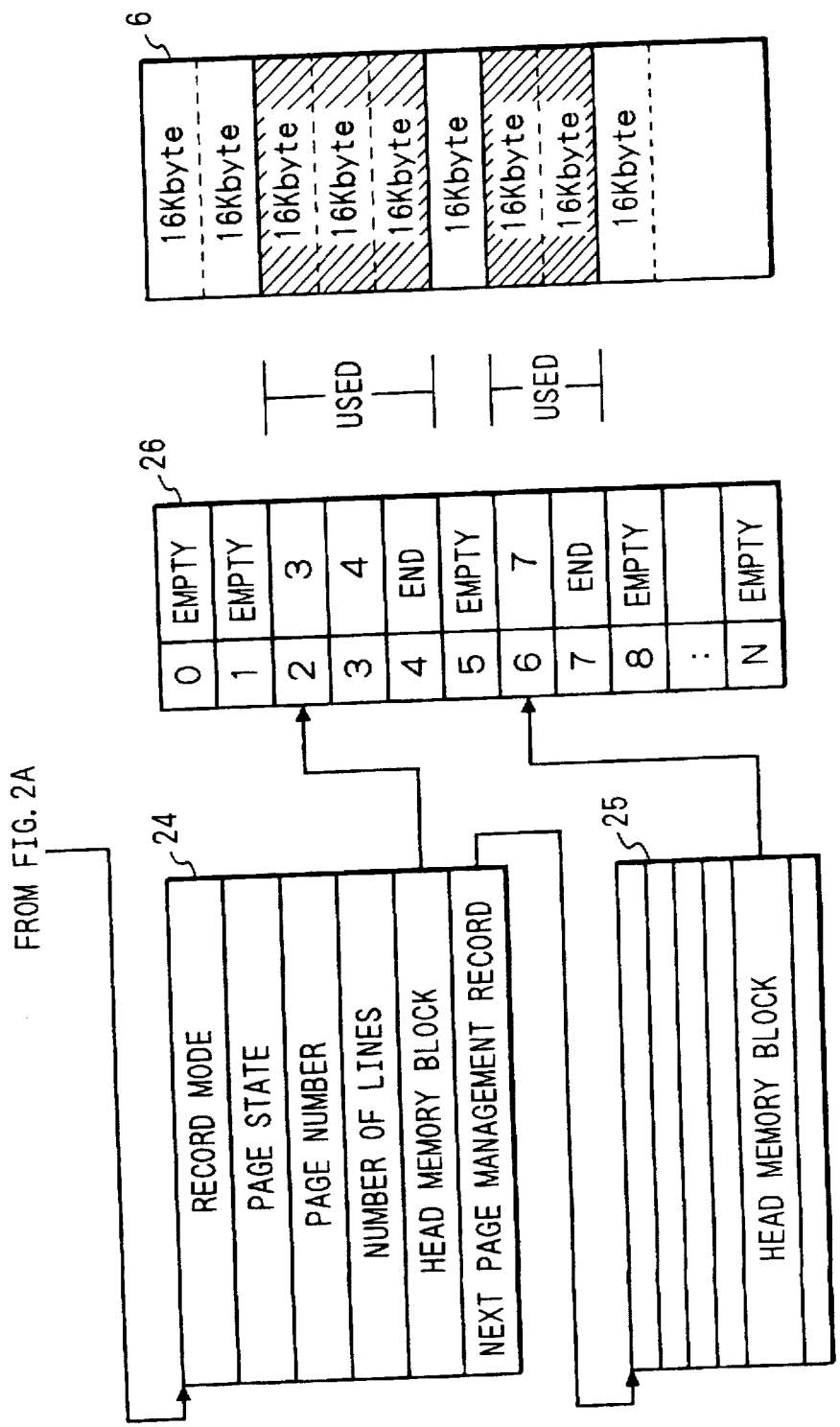

Referring to FIGS. 2A and 2B, an image memory management system of the present embodiment is explained.

In the present embodiment, individual communication is managed by image management records 21, 22 and 23. The image management record comprises items such as management number, preparation time, addressee, pointer to next image management record and pointer to page management record, and it is placed in the RAM 3.

The pointer to the image management record is written in a management table on the RAM 3 called a queue 20, and when a plurality of image management records are connected in one queue, a pointer to the continuing image management record is written in the item "next image management record" in the end image management record as shown by the image management records 21 and 22.

In the transmission and the recording, the next image management record is searched in sequence by the pointer of the image management record written in the queue to select the desired image. At the initialization, all management records are connected to a vacant queue.

One page of image is managed by page management records 24 and 25. It is prepared for each reading or reception of one page and comprises items such as record mode, page status, page number, number of lines, pointer of the next page management record and heading memory block number, and it is placed on the RAM 3. At the initialization, all page management records are connected to a vacant management record, not shown.

The image memory (DRAM) 6 is managed by a 16K-byte memory block. Each block is assigned a management number starting from 0 and managed by a memory block management table 26. At initialization, a code indicating the vacancy is written in the corresponding items of the memory block management table.

When the image memory is to be used for a communication reservation operation, one image management record is taken off the vacant queue and is connected to the transmission queue. Then, one page management record is taken off the vacant management table and a pointer is written in the item of the page management record of the previously acquired image management record.

Then, a block number in which the vacant code is written is selected from the memory block management table, and a block number to be used is written in the item of the heading memory block number of the page management record. A code indicating the last block is also written in the memory block management table. When two or more memory blocks are to be used, the next memory block management number is written and the last block code is written in the column corresponding to the next memory block.

When an image is to be erased, the image management record is connected to a vacant queue, the page management record is connected to a vacant management table, and the items from heading block to the last block indicated by the page management record to be erased in the memory block management table are changed to the vacant codes.

Figure 4:
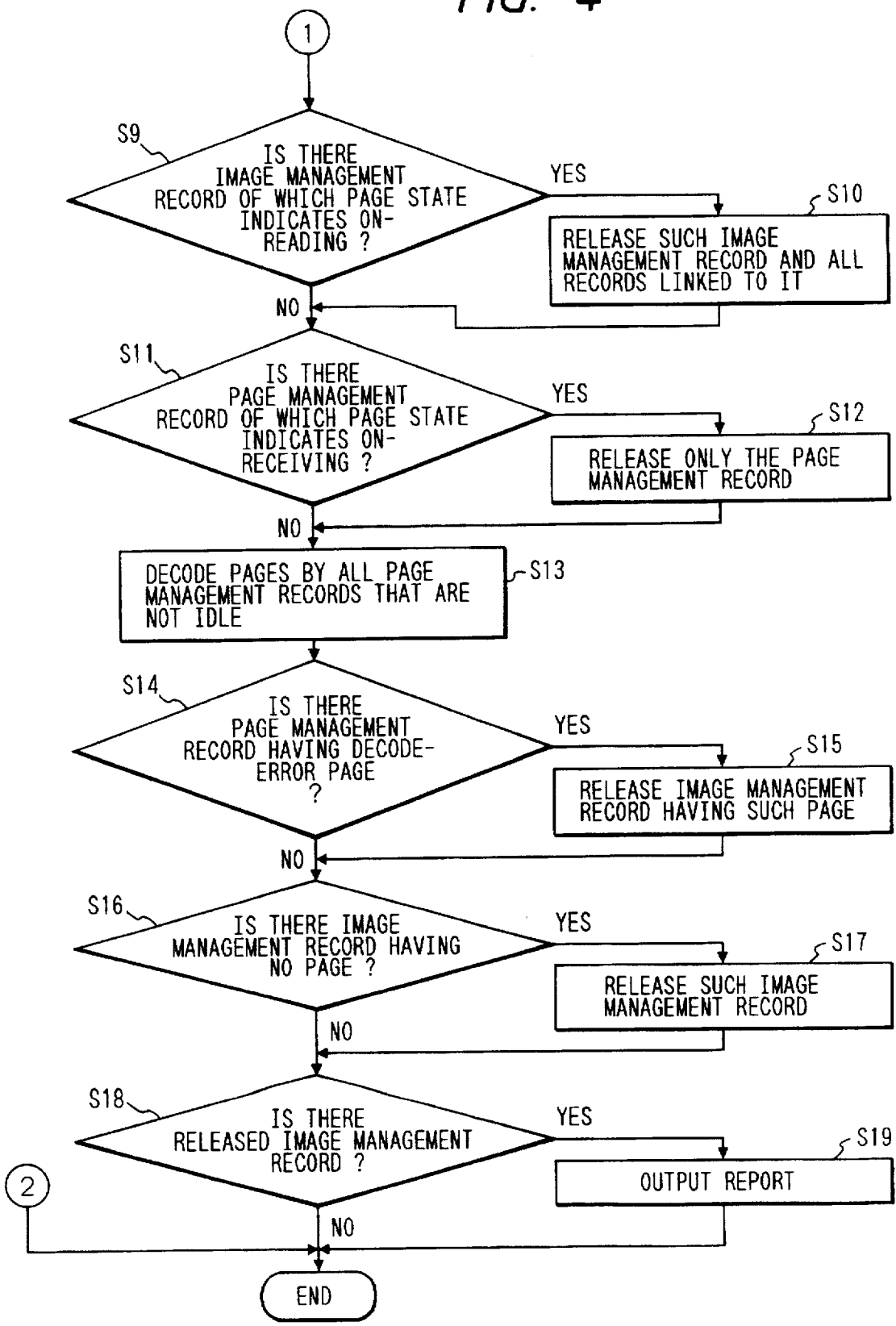
FIG. 4 shows a flow chart of a memory verification operation in that embodiment.

Referring to flow charts of FIGS. 3 and 4, an image memory verification operation of the CPU 1 at the power-up is now explained.

The number of image management records connected to the respective queues is summed (S1) and a total number of image management records appeared is counted. Whether the sum is equal to the total number or not is determined (S2). Whether the image management record once appeared duplicates or not is also determined (S3). If an error occurs up to this point, the entire system is reset (S8) and the image memory is cleared.

For the page management record, the total number and the duplication are checked in the same manner (S4, S5, S6) and if an error occurs, a report is outputted for the image management record which is to have a page (S7), the entire system is reset (S8) and the image memory is cleared.

If the status of a page indicates that it is being read (S9) then even if no error has occurred up to this point, the image management record therefor and all page management records connected thereto are released (S10). If the state of a page indicates that it is receiving (S11), only the page management record thereof is cleared (S12).

Thereafter, the images managed by all non-vacant page management records are decoded (S13), and if there is an error page (S14), the image management record of that page is released (S15).

If there is an image management record having no page (S16), it is released (S17).

After those steps, if there is a released image management record (S18), a report is outputted (S19).

In accordance with the present embodiment, the non-volatile image memory is divided into blocks, each block is managed by page, each page is managed by image, and the consistency of them is verified at the power-up. Thus, even if there is any error in the content of the image memory during the power shut-down, it may be notified prior to the operation of the system and wasteful recording or transmission is prevented.

While the memory management system of the facsimile apparatus has been described in the present embodiment, it should be understood that the present invention is equally applicable to the memory management system of apparatus other than the facsimile apparatus.

What is claimed is:

1. A memory data management method comprising the steps of:

generating management information for managing data in a data memory when the data is stored into the data memory, and storing the generated management information into a management information memory, the management information including first information for identifying the data, and at least the first information being stored into the management information memory irrespective of a physical construction of the data memory;

determining, in response to the application of power to a data processing apparatus, whether or not there is an error in management information stored in the management information memory; and clearing data corresponding to the management information including an error in accordance with the determination in said determination step.

2. A memory data management method according to claim 1, wherein said management information includes a plurality of data management records and a plurality of page management records, and each data management record manages its respective data, and includes second information for associating other data management records and third information for associating the page management record for managing one page of data.

3. A memory data management method according to claim 2 wherein said determination step includes a step for determining if the number of data management records matches a first predetermined number or not, and clears the data corresponding to the management information when the number of data management records does not match the first predetermined number.

4. A memory data management method according to claim 2 wherein said determination step includes a step for determining the presence or absence of duplicate data management record, and clears the data corresponding to the management information when a duplicate data management record is present.

5. A memory data management method according to claim 2 wherein said determination step includes a step for determining if the number of page management records matches a second predetermined number, and clears the data corresponding to the management information when the number of page management records does not match the second predetermined number.

6. A memory data management method according to claim 2 wherein said determination step includes a step for determining the presence or absence of duplicate page management record, and clears the data corresponding to the management information when a duplicate page management record is present.

7. A memory data management method according to claim 2 further comprising the step of visually outputting error information for an error data management record.

8. A memory data management method according to claim 2 wherein said determination step determines if the storing of the data corresponding to the data management record being used into the memory is completed or not, and if not completed, renders the uncompleted data management record unused.

9. A memory data management method according to claim 2 wherein said determination step determines if the storing of the data corresponding to the page management record being used into the memory is completed or not, and if not completed, renders the uncompleted page management record unused.

10. A memory data management method according to claim 2 wherein said determination step determines if there is an error in the memory data corresponding to each of the page management record being used, and renders the page management record having a data error unused.

11. A memory data management method according to claim 2 wherein said determination step determines if the data corresponding to each of the page management records being used is stored in the memory or not, and if the corresponding data is not stored in the memory, renders the page management record of that page unused.

12. A memory data management apparatus comprising:

generating/storing means for generating management information for managing data in a data memory when the data is stored into the data memory and storing the generated management information into a management information memory, the management information including first information for identifying the data, and at least the first information being stored into the management information memory irrespective of a physical construction of the data memory;

determination means for determining, in response to the application of power to a data processing apparatus, whether or not there is an error in the management information stored in the management information memory; and clearing means for clearing data corresponding to the management information including an error in accordance with the determination provided by said determination means.

13. A memory data management apparatus according to claim 12, wherein said management information includes a plurality of data management records and a plurality of page management records, and each data management record manages its respective data, and includes second information for associating another data management record and third information for associating the page management record for managing one page of data.

14. A memory data management apparatus according to claim 13, wherein said determination means further determines if the number of data management record matches a first predetermined number or not, and said clearing means clears the data corresponding to the management information when the number of data management records does not match the first predetermined number.

15. A memory data management apparatus according to claim 13, wherein said determination means further determines the presence or absence of duplicate data management records, and said clearing means clears the data corresponding to the management information when a duplicate data management record is present.

16. A memory data management apparatus according to claim 13, wherein said determination means further determines if the number of page management records matches a second predetermined number, and said clearing means clears the data corresponding to the management information when the number of page management records does not match the second predetermined number.

17. A memory data management apparatus according to claim 13, wherein said determination means further determines the presence or absence of duplicate page management records, and said clearing means clears the data corresponding to the management information when a duplicate page management record is present.

18. A memory data management apparatus according to claim 13, further comprising means for outputting error information for an erroneous data management record.

19. A memory data management apparatus according to claim 13, wherein said determination means determines if the storing of the data corresponding to the data management record being used into the memory is completed or not, and if not completed, renders the uncompleted data management record unusable.

20. A memory data management apparatus according to claim 13, wherein said determination means determines if the storing of the data corresponding to the page management record being used into the memory is completed or not, and if not completed, renders the uncompleted page management record unusable.

21. A memory data management apparatus according to claim 13 wherein said determination means determines if there is an error in the memory data corresponding to each of the page management record being used, and renders the page management record having a data error unusable.

22. A memory data management apparatus according to claim 13 wherein said determination means determines if the data corresponding to each of the page management records being used is stored in the memory or not, and if the corresponding data is not stored in the memory, renders the page management record of that page unusable.

* * * * *

UNITED STATES PATENT AND TRADEMARK OFFICE
CERTIFICATE OF CORRECTION

PATENT NO. : 5,784,174

DATED : July 21, 1998

INVENTOR(S): TORU FUJINO, ET AL.

It is certified that error appears in the above-identified patent and that said Letters Patent is hereby corrected as shown below:

COLUMN 3

Line 60, "read (S9)" should read --(S9),--.

Signed and Sealed this

Eleventh Day of May, 1999

Attest:

Q. TODD DICKINSON

Attesting Officer

Acting Commissioner of Patents and Trademarks